United States Patent
Oh et al.

(10) Patent No.: US 10,587,139 B2
(45) Date of Patent: Mar. 10, 2020

(54) METHOD AND APPARATUS FOR CONTROLLING BATTERY

(71) Applicant: SAMSUNG ELECTRONICS CO., LTD., Suwon-si (KR)

(72) Inventors: Duk Jin Oh, Seoul (KR); Tae Won Song, Yongin-si (KR); Jinho Kim, Yongin-si (KR); Ju Wan Lim, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 181 days.

(21) Appl. No.: 15/712,349

(22) Filed: Sep. 22, 2017

(65) Prior Publication Data

US 2018/0145528 A1     May 24, 2018

(30) Foreign Application Priority Data

Nov. 22, 2016  (KR) .................. 10-2016-0155713

(51) Int. Cl.
*H02J 7/00*    (2006.01)
*H02J 7/14*    (2006.01)
*H02J 7/04*    (2006.01)
*H01M 10/44*   (2006.01)
*G01R 31/382*  (2019.01)

(52) U.S. Cl.
CPC .......... *H02J 7/0063* (2013.01); *H01M 10/44* (2013.01); *H02J 7/042* (2013.01); *H02J 7/045* (2013.01); *H02J 7/047* (2013.01); *G01R 31/382* (2019.01); *H02J 2007/0067* (2013.01)

(58) Field of Classification Search
USPC ......................................................... 320/136
See application file for complete search history.

(56) References Cited

U.S. PATENT DOCUMENTS

| | | | |
|---|---|---|---|
| 8,624,560 B2 | 1/2014 | Ungar et al. | |
| 2009/0273320 A1* | 11/2009 | Ungar ................. | H01M 4/5815 320/162 |
| 2013/0009604 A1 | 1/2013 | Bhardwaj et al. | |
| 2013/0119940 A1* | 5/2013 | Iriyama ................. | H01M 4/485 320/134 |
| 2013/0293200 A1* | 11/2013 | Obata ................... | H02J 7/0021 320/134 |
| 2014/0002031 A1* | 1/2014 | Chaturvedi ........... | H01M 10/44 320/152 |
| 2014/0184165 A1* | 7/2014 | Takahashi ............. | H01M 10/48 320/134 |
| 2015/0002157 A1 | 1/2015 | Everett et al. | |
| 2015/0303723 A1* | 10/2015 | Raghavan ............. | H02J 7/0052 320/107 |

(Continued)

FOREIGN PATENT DOCUMENTS

| | | |
|---|---|---|
| JP | 2015-104225 A | 6/2015 |
| JP | 2016-096642 A | 5/2016 |

(Continued)

*Primary Examiner* — Alexis B Pacheco
(74) *Attorney, Agent, or Firm* — NSIP Law (57) ABSTRACT

A method and apparatus for controlling a battery, the apparatus configured to measure a current usage of a battery, generate a concentration limitation condition on a material in an active material of the battery based on a characteristic of the active battery, and control a usage of the battery based on the current usage and the concentration limitation condition.

20 Claims, 6 Drawing Sheets

(56) References Cited

U.S. PATENT DOCUMENTS

| | | | | |
|---|---|---|---|---|
| 2016/0023567 A1* | 1/2016 | Lee | ............... | B60L 11/1861 |
| | | | | 320/136 |
| 2016/0254562 A1* | 9/2016 | Morris-Cohen | ...... | H01M 8/188 |
| | | | | 320/128 |
| 2017/0052228 A1* | 2/2017 | Hariharan | ........... | H01M 10/484 |

FOREIGN PATENT DOCUMENTS

| | | |
|---|---|---|
| KR | 10-0354243 B1 | 9/2002 |
| KR | 10-2013-0075408 A | 7/2013 |
| KR | 10-2013-0098611 A | 9/2013 |
| KR | 10-1509897 B1 | 4/2015 |
| KR | 10-2016-0039364 A | 4/2016 |
| KR | 10-1620222 B1 | 5/2016 |
| WO | WO 2010/013102 A1 | 2/2010 |

\* cited by examiner

METHOD AND APPARATUS FOR CONTROLLING BATTERY

CROSS-REFERENCE TO RELATED APPLICATION(S)

This application claims the benefit under 35 USC § 119(a) of Korean Patent Application No. 10-2016-0155713 filed on Nov. 22, 2016, in the Korean Intellectual Property Office, the entire disclosure of which is incorporated herein by reference for all purposes.

BACKGROUND

1. Field

The following description relates to battery control technology.

2. Description of Related Art

A battery is used as a power source for a mobile device or an electric vehicle. As the battery is charged or discharged, the battery deteriorates over time reducing the battery life. A variety of schemes for charging the battery have been proposed. In general, a widely used constant current/constant voltage (CC/CV) charging scheme charges a battery with a constant current up to a specific voltage and then charges the battery with a constant voltage until the battery reaches a preset low current. In addition, a multi-step charging scheme of charging a battery with multi-step constant currents from a high current to a low current and a pulse charging scheme of repeatedly applying a pulse current based on a relatively short time unit are used.

With an increase in the number of users of electric vehicles and mobile devices that includes a battery, there is a desire for technology for increasing battery life characteristics. Also, there is a desire for technology for controlling a potential of the battery to prevent degradation in the battery that may occur during the charging and discharging of the battery.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method of controlling a battery includes measuring a current usage environment of a battery, generating a concentration limitation condition on a material included in an active material of the battery based on a characteristic of the active material, and controlling a usage environment of the battery based on the current usage environment and the concentration limitation condition.

The controlling of the usage environment of the battery may include calculating a current concentration distribution of the material included in the active material based on the current usage environment and the characteristic of the active material, and controlling a current of the battery based on whether the current concentration distribution satisfies the concentration limitation condition.

The method may further include generating a potential limitation condition on an electrode of the battery based on the current usage environment and the concentration limitation condition, and controlling the usage environment of the battery based on the current usage environment and the potential limitation condition.

The controlling of the usage environment of the battery may include calculating a current potential distribution of the electrode based on the current usage environment and the characteristic of the active material, and controlling a current of the battery based on whether the current potential distribution satisfies the potential limitation condition.

The method may further include determining a side reaction potential that triggers a side reaction between the material and an electrolyte in which the material moves based on any one or any combination of any two or more of the characteristic of the active material, a characteristic of the material, and a characteristic of the electrolyte, and controlling the usage environment of the battery based on the current usage environment and the side reaction potential.

The controlling of the usage environment of the battery may include calculating a current potential distribution of an electrode of the battery based on the current usage environment and the characteristic of the active material, and controlling a current of the battery by comparing the current potential distribution to the side reaction potential.

The active material may include a positive active material and a negative active material, and the generating of the concentration limitation condition may include determining an upper limit concentration and a lower limit concentration of a material included in the positive active material and an upper limit concentration and a lower limit concentration of a material included in the negative active material.

The method may further include generating a potential limitation condition on an electrode of the battery based on the current usage environment and the concentration limitation condition and controlling the usage environment of the battery based on the current usage environment and the potential limitation condition, and the generating of the potential limitation condition may include calculating an upper limit concentration and a lower limit concentration of a positive electrode based on the upper limit concentration and the lower limit concentration of the material included in the positive active material and calculating an upper limit concentration and a lower limit concentration of a negative electrode based on the upper limit concentration and the lower limit concentration of the material included in the negative active material.

The current usage environment may include a temperature, a voltage, and a current of the battery.

The generating of the concentration limitation condition may include generating the concentration limitation condition based on a degree of degradation in the battery.

The controlling of the usage environment of the battery may include estimating a battery state including a state of charge (SOC) of the battery and determining a maximum available power for charging or discharging during a standard time based on the battery state and the concentration limitation condition.

The determining of the maximum available power may include setting the maximum available power based on the battery state and adjusting the set maximum available power based on the concentration limitation condition.

The adjusting of the set maximum available power based on the concentration limitation condition may include calculating a predicted concentration distribution of the material included in the active material under a condition that charging or discharging of the set maximum available power is performed during the standard time and adjusting the set maximum available power based on whether the predicted concentration distribution satisfies the concentration limitation condition.

The determining of the available power may further include generating a potential limitation condition on an electrode of the battery based on the current usage environment and the concentration limitation condition and adjusting the set maximum available power based on the potential limitation condition.

The adjusting of the set maximum available power based on the potential limitation condition may include calculating a predicted potential distribution of the electrode under a condition that charging or discharging of the set maximum available power is performed during the standard time and adjusting the set maximum available power based on whether the predicted potential distribution satisfies the potential limitation condition.

The determining of the maximum available power may further include determining a side reaction potential that triggers a side reaction between the material and an electrolyte in which the material moves based on any one or any combination of any two or more of the characteristic of the active material, a characteristic of the material, and a characteristic of the electrolyte and adjusting the set maximum available power based on the side reaction potential.

The adjusting of the set maximum available power based on the side reaction potential may include calculating a predicted potential distribution of an electrode of the battery under a condition that charging or discharging of the set maximum available power is performed during the standard time and adjusting the set maximum available power by comparing the predicted potential distribution to the side reaction potential.

In another general aspect, a battery control apparatus includes a processor configured to measure a current usage environment of a battery, generate a concentration limitation condition on a material included in an active material of the battery based on a characteristic of the active battery, and control a usage environment of the battery based on the current usage environment and the concentration limitation condition.

Other features and aspects will be apparent from the following detailed description, the drawings, and the claims.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 1:
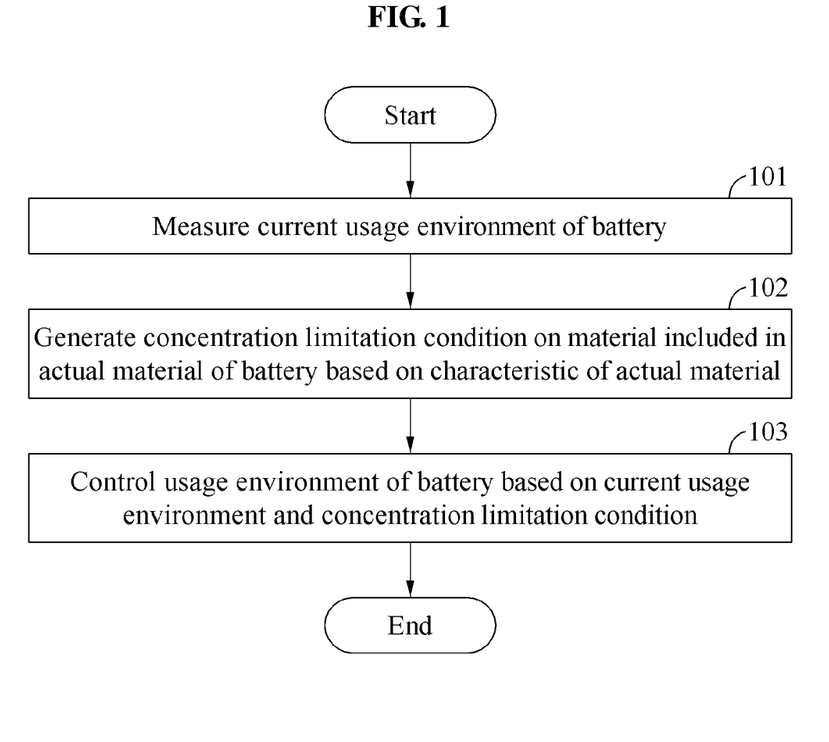
FIG. 1 illustrates an example of a method of controlling a battery.

FIG. 1 illustrates an example of a method of controlling a battery.

Referring to FIG. 1, in operation 101, the battery control apparatus measures a current usage environment of a battery. The current usage environment of the battery is a usage environment of a battery that is currently used and includes, for example, a temperature, a voltage, a current, a C-rate, a state of charge (SOC), a state of health (SOH) of the battery, a concentration of a material included in an actual material of the battery, and a potential of an electrode of the battery. The current usage environment of the battery is estimated or measured by the battery control apparatus.

The battery includes a charger or a secondary cell configured to store power by charging, and a device to which the battery is mounted may supply the power from the battery to a load. The load is an entity that consumes power and may consume power externally supplied. For example, the load includes an electric heater, a light, a motor of an electric vehicle, and the like, that consume power using a circuit in which current flows at a specific voltage. The battery may be a lithium ion battery having an electrode include an actual material corresponding to a lithium compound, and a material included (or constituent material) in the actual material may be lithium ions ($Li^+$). Hereinafter, a battery control method applied to a lithium ion battery will be described, and embodiments are also applicable to another type of battery including the lithium ion battery. The battery includes an electrode to and from which the lithium ions are intercalated and deintercalated, and the battery control apparatus estimates a potential of the electrode.

The battery control apparatus is an apparatus configured to control the battery, and may be configured as a software module, a hardware module, or a combination thereof. For example, the battery control apparatus may be configured by a battery management system (BMS). The BMS is a system that manages the battery, and for example, monitors a state of the battery, maintains an optimal condition on an operation of the battery, predicts a replacement timing of the battery, detects a fault of the battery, generates a control signal or a command signal associated with the battery, and controls the state or the operation of the battery.

Measuring the temperature of the battery includes directly measuring a temperature of a battery that is a target of charging, or acquiring a temperature measured by another device. The C-rate indicates a battery related current characteristic that denotes a charging and discharging rate of current according to the battery capacity and a unit of [C] is used. For example, if the battery capacity has a current amount available for 1 hour that is 1000 milliampere hours (mAh) and the charging and discharging current is 1 A, the C-rate is 1 C=1 A/1000 mAh.

The SOC is a parameter that indicates a charging state of the battery. Since the SOC indicates the level of energy stored in the battery, the amount of energy stored in the battery may be indicated as 0 to 100% using a percentage unit. For example, 0% indicates a completely discharged state and 100% indicates a fully charged state. This representation method may be variously modified and defined based on the design intent or example embodiments.

The SOH is a parameter that quantitatively indicates a change in the battery life characteristic of a battery by an aging effect, for example, a degradation phenomenon. The SOH indicates a level of degradation in the battery life or capacity of the battery. Various schemes may be employed when the battery charging apparatus estimates the SOC and the SOH.

The battery control apparatus may acquire a battery related characteristic from a preconfigured database to estimate or measure the current usage environment. The battery related characteristic includes, for example, a current state of the battery, characteristics of materials included in the battery, and setting values of the battery. The database may be configured as a memory included in the battery control apparatus, or may be configured as an external apparatus, for example, a server, etc., connected to a network and the like in a wired and/or wireless manner.

In operation 102, the battery control apparatus generates a concentration limitation condition on a material included in the actual material of the battery based on a characteristic of the actual material. The battery control apparatus generates the concentration limitation condition based on a characteristic of a positive actual material, a characteristic of a negative actual material, and a degree of degradation in the battery, for example, the SOH of the battery.

In operation 103, the battery control apparatus controls the usage environment of the battery based on the current usage environment and the concentration limitation condition. The battery control apparatus calculates a current concentration distribution of the material included in the actual material based on the current usage environment and the characteristic of the actual material. The battery control apparatus controls a current of the battery based on whether the current concentration distribution satisfies the concentration limitation condition. The battery control apparatus controls the current of the battery to adjust a C-rate based on charging or discharging of the battery. Controlling of the current of the battery includes an operation of adjusting the C-rate of the battery. Controlling of the C-rate of the battery includes an operation of adjusting the current of the battery. Here, the C-rate or the current may be controlled during the charging or the discharging of the battery.

The battery control apparatus repetitively adjusts the current such that the current concentration distribution satisfies the concentration limitation condition. Also, the battery control apparatus terminates a control of the current usage environment under a condition that the current concentration distribution satisfies the concentration condition. Terminating the control of the current usage environment includes an operation of maintaining a current that satisfies conditions related to potentials of a positive electrode and a negative electrode and terminating an adjustment of the maintained current. For example, when a 1 C current satisfies conditions related to potentials of a positive electrode and a negative electrode and a concentration the lithium ions, the battery control apparatus maintains the 1 C current. The battery control apparatus estimates a maximum value or a minimum value of the current concentration distribution and compares an estimated value to the concentration limitation condition, thereby determining whether the concentration limitation condition is satisfied. Hereinafter, an example of controlling the battery based on the concentration limitation condition will be described with reference to FIG. 2.

Figure 2:
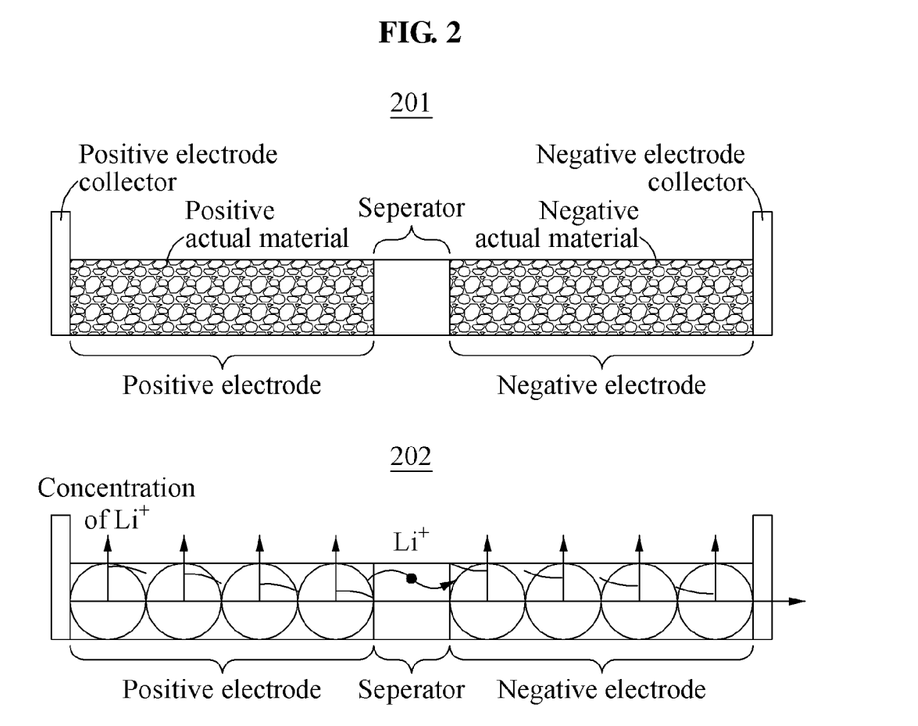
FIG. 2 illustrates an example of an electrochemical model of a battery.

FIG. 2 illustrates an example of an electrochemical model of a battery.

FIG. 2 illustrates a cross-section 201 of a battery and an electrochemical model 202 of the battery. The battery includes two electrodes to and from which lithium ions are intercalated and deintercalated, an electrolyte in which the lithium ions move, a separator that physically separate a positive electrode from a negative electrode to prevent electrons from flowing directly and passes ions, and a positive electrode collector and a negative electrode collector configured to collect electrons generated from an electrochemical reaction and supply electrons used for the electrochemical reaction. The positive electrode includes a positive actual material and the negative electrode includes a negative actual material. For example, lithium cobalt oxide ($LiCoO_2$) is used as the positive actual material and graphite (C6) is used as the negative actual material. During a charging of the battery, the lithium ions move from the positive electrode to the negative electrode. During a discharging of the battery, the lithium ions move from the negative electrode to the positive electrode. Thus, a concentration of the lithium ions in the positive actual material and a concentration of the lithium ions in the negative actual material are changed through the charging and the discharging. The battery control apparatus calculates the current concentration distribution of the lithium ions in the positive electrode and the negative electrode based on the current usage environment and the characteristic of the actual material, and controls the usage environment of the battery such that the calculated current concentration distribution satisfies the concentration limitation condition. Depending on examples, the battery control apparatus controls the usage environment of the battery based on a current concentration distribution of the lithium ions on a surface of a positive active material in the positive electrode and/or a surface of a negative active material in the negative electrode.

The battery control apparatus determines an upper limit concentration $C_{s,c\_max}$ and a lower limit concentration $C_{s,c\_min}$ of the lithium ions included in the positive active material based on a characteristic and a degree of degradation in the positive active material. Also, the battery control apparatus determines an upper limit concentration $C_{s,a\_max}$ and a lower limit concentration $C_{s,a\_min}$ of the lithium ions included in the negative active material based on a characteristic and a degree of degradation in the negative active material. For example, the battery control apparatus sets a concentration limitation condition on the lithium ions included in the positive active material of the positive electrode at a beginning of life (BOL) to be "$0.5<C_c<1$", and sets a concentration limitation condition on the lithium ions included in the negative active material of the negative electrode at the BOL to be "$0<C_a<1$". Here, $C_c$ and $C_a$ denote a concentration of the lithium ions of the positive active material and a concentration of the lithium ions of the negative active material. When $C_c$ is less than 0.5, a structure of the positive active material and an irreversible reaction occurs, which may lead to degradation in the positive electrode. When $C_a$ is greater than 1, a lithium plating phenomenon that a lithium metal is deposited on the surface of the negative active material may occur, which may lead to degradation in the negative electrode.

The battery control apparatus calculates the current concentration distribution of the lithium ions in the positive electrode based on the current usage environment and the positive active material. Also, the battery control apparatus calculates the current concentration distribution of the lithium ions in the negative electrode based on the current usage environment and the negative active material. For example, the battery control apparatus calculates the current concentration distribution in a thickness direction of the battery as indicated by the electrochemical model 202 of the battery. The thickness direction of the battery indicates a direction from the separator toward the positive electrode collector or the negative electrode collector, or a direction opposite thereto. In the electrochemical model 202, the x axis indicates a location based on the thickness direction of the battery, and the y axis indicates a current concentration distribution of the lithium ions at a predetermined location based on the thickness direction of the battery.

The battery control apparatus calculates the current concentration distribution of the lithium ions in the positive electrode and the negative electrode using an electrochemical model implemented by a governing equation, for example, Equations 1 through 5 as below.

$$j = k_0 c_e^{1-\alpha}(c_{s,max} - c_s)^{1-\alpha} c_s^\alpha \left\{ \exp\left(\frac{(1-\alpha)F}{RT}\eta\right) - \exp\left(\frac{\alpha F}{RT}\eta\right) \right\} \quad \text{[Equation 1]}$$

$$\nabla \cdot (-\sigma_{\mathit{eff}} \nabla \overline{\phi}_s) = -a_s F \overline{j} \quad \text{[Equation 2]}$$

$$\nabla \cdot (\kappa_{\mathit{eff}} \nabla \overline{\phi}_e + \kappa_{D,\mathit{eff}} \nabla \ln \overline{c}_e) + a_s \overline{j} F = 0 \quad \text{[Equation 3]}$$

$$\frac{\partial (\varepsilon_e \overline{c}_e)}{\partial t} = \nabla \cdot (D_{e,\mathit{eff}} \nabla \overline{c}_e) + a_s(1 - t_+^0)\overline{j} \quad \text{[Equation 4]}$$

$$\frac{\partial c_s}{\partial t} = \frac{1}{r^2} \frac{\partial}{\partial r}\left(D_s r^2 \frac{\partial c_s}{\partial r}\right) \quad \text{[Equation 5]}$$

Equation 1 is a Butler-Volmer equation, Equation 2 is a charge equilibrium equation of an actual material, Equation 3 is a charge equilibrium equation of an electrolyte, Equation 4 is a material diffusion equation of the electrolyte, and Equation 5 is a material diffusion equation of the actual material. In Equations 1 through 5, j denotes a current density generated from an oxidation-reduction reaction, $k_0$ denotes a chemical reaction rate constant, $C_e$ denotes a lithium ion concentration of an electrolyte, $\alpha$ denotes a transfer equilibrium constant, $c_{s,max}$ denotes a maximum value of a lithium ion concentration of an electrode, $C_s$ denotes a concentration of the lithium ions of the electrode, R denotes a universal gas constant, T denotes a temperature, F denotes a faraday constant, $\eta$ denotes an overpotential, $\sigma_{\mathit{eff}}$ denotes an effective conductivity of the electrode, $\Phi_s$ denotes a potential of the electrode, $a_z$ denotes a specific interfacial area of an actual material of the electrode, $\kappa_{\mathit{eff}}$ denotes an effective conductivity of the electrolyte, $\Phi_s$ denotes a potential of the electrolyte, $\kappa_{D,\mathit{eff}}$ denotes a diffusion conductivity of the electrolyte, $\varepsilon_s$ denotes a volume fraction of the electrolyte, $D_{e,\mathit{eff}}$ denotes an effective diffusion coefficient of the electrolyte, t denotes a time, $t_+^0$ denotes a number of ion transferences, r denotes a radius of the active material, and $D_s$ denotes a diffusion coefficient of the lithium ions in the electrode.

The battery control apparatus applies the current usage environment and the characteristic of the active material to a predesigned electrochemical model. Using the electrochemical model, the battery control apparatus obtains the current concentration distribution of the lithium ions of the positive active material and the current concentration distribution of the lithium ions of the negative active material as shown by the electrochemical model 202 of FIG. 2. In this example, the positive active material and the negative active material are modeled as circle-shaped active materials. The battery control apparatus calculates current concentration distributions $C_c$ and $C_a$ of the lithium ions of the modeled active materials, and dynamically controls the usage environment of the battery such that the calculated $C_c$ and $C_a$ satisfy "$C_{s,c\_min}<C_c<C_{s,c\_max}$" and "$C_{s,a\_min}<C_a<C_{s,a\_max}$", respectively. The battery control apparatus calculates $C_c$ and $C_a$ during the charging and discharging of the battery, and controls the current. The battery control apparatus controls the usage environment of the battery based on the potential of the electrode. Related descriptions will be provided with reference to FIGS. 3 and 4.

Figure 3:
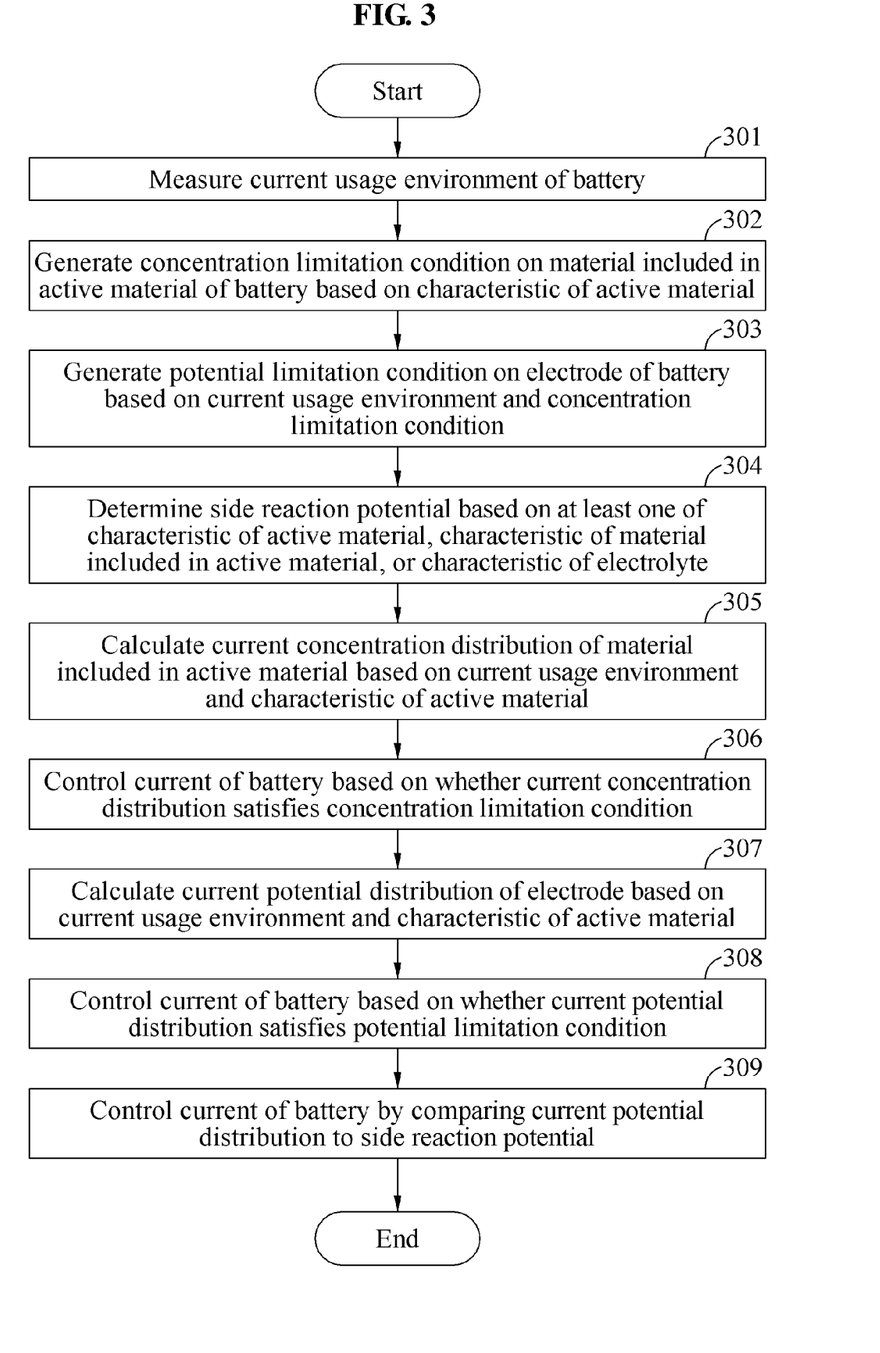
FIG. 3 illustrates an example of a method of controlling a battery.

FIG. 3 illustrates an example of a method of controlling a battery.

Referring to FIG. 3, in operation 301, a battery control apparatus measures a current usage environment of a battery. In operation 302, the battery control apparatus generates a concentration limitation condition on a material included in an active material of the battery based on a characteristic of the active material. In terms of generating the concentration limitation condition, the foregoing examples are also applicable.

In operation 303, the battery control apparatus generates a potential limitation condition on an electrode of the battery based on the current usage environment and the concentration limitation condition. The battery control apparatus generates the potential limitation condition using an electrochemical model based on the current usage environment and the concentration limitation condition. The battery control apparatus calculates an upper limit potential and a lower limit potential of a positive electrode based on an upper limit concentration and a lower limit concentration of a material included in a positive active material, and calculates an upper limit potential and a lower limit potential of a negative electrode based on an upper limit concentration and a lower limit concentration of a material included in a negative active material.

For example, using Equations 1 through 3, the battery control apparatus calculates a lower limit potential $\phi_{s,c\_min}$ using $C_{s,c\_max}$ in the positive electrode, calculates an upper limit potential $\phi_{s,c\_max}$ using $C_{s,c\_min}$ in the positive electrode, calculates a lower limit potential $\phi_{s,a\_min}$ using $C_{s,a\_max}$ in the negative electrode, and calculates an upper limit potential $\phi_{s,a\_max}$ using $C_{s,a\_min}$ in the negative electrode. The battery control apparatus generates a potential limitation condition "$\phi_{s,c\_min}<\phi_{s,c}<\phi_{s,c\_max}$" of the positive electrode and a potential limitation condition "$\phi_{s,a\_min}<\phi_{s,a}<\phi_{s,a\_max}$" of the negative electrode based on the calculated upper and lower limit potentials. Here, $\phi_{s,c}$ and $\phi_{s,a}$ denote a positive potential and a negative potential, respectively. The battery control apparatus may calculate the upper limit potential and the lower limit potential of the positive electrode in consideration of a current concentration distribution of the lithium ions in the positive active material. Also, the battery control apparatus may calculate the upper limit potential and the lower limit potential of the negative electrode in consideration of a current concentration distribution of the lithium ions in the negative active material. The battery control apparatus applies the current concentration distribution of the lithium ions to obtain the potential limitation condition so as to dynamically generate the potential limitation condition during charging and discharging.

In operation 304, the battery control apparatus determines a side reaction potential based on any one or any combination of any two or more of a characteristic of the active material, a characteristic of the material included in the active material, and a characteristic of an electrolyte. The side reaction potential may be a positive potential and a negative potential causing a side reaction between the electrolyte and the material. When the positive potential exceeds a side reaction potential of the positive electrode, an electrolyte oxidation occurs on a surface of the positive active material, which may lead to degradation in the positive electrode. When the negative potential is less than a side reaction potential of the negative electrode, a lithium plating phenomenon occurs on a surface of the negative active material, which may lead to degradation in the negative electrode. The battery control apparatus determines the side reaction potentials of the positive electrode and the negative electrode based on the current usage environment and a characteristic of the battery.

In operation 305, the battery control apparatus calculates a current concentration distribution of the material included in the active material based on the current usage environment and the characteristic of the active material. In operation 306, the battery control apparatus controls a current of the battery based on whether the current concentration distribution satisfies the concentration limitation condition. The foregoing descriptions are also applicable to an example of controlling the battery based on the concentration limitation condition.

In operation 307, the battery control apparatus calculates a current potential distribution of the electrode based on the current usage environment and the characteristic of the active material. By applying the current usage environment and a characteristic of the positive active material to the electrochemical model, the battery control apparatus dynamically calculates the current potential distribution $\phi_{s,c}$ of the positive electrode. Similarly, by applying the current usage environment and a characteristic of the negative active material to the electrochemical model, the battery control apparatus dynamically calculates the current potential distribution $\phi_{s,a}$ of the negative electrode.

In operation 308, the battery control apparatus controls the current of the battery based on whether the current potential distribution satisfies the potential limitation condition. For example, the battery control apparatus repetitively adjusts the current such that the current potential distribution satisfies the potential limitation condition, and terminates a control of the current usage environment under a condition that the current potential distribution satisfies the potential limitation condition. The battery control apparatus extracts a maximum value or a minimum value of the current potential distribution and compare the extracted maximum or minimum value to the potential limitation condition, thereby determining whether the potential limitation condition is satisfied.

The battery control apparatus dynamically controls the usage environment of the battery such that $\phi_{s,c}$ and $\phi_{s,a}$ satisfy "$\phi_{s,c\_min}<\phi_{s,c}<\phi_{s,c\_max}$" and "$\phi_{s,a\_min}<\phi_{s,a}<\phi_{s,a\_max}$", respectively. The battery control apparatus calculates $\phi_{s,c}$ and $\phi_{s,a}$ during the charging and discharging of the battery and dynamically calculates the potential limitation condition to which the current concentration distribution of the lithium ions is applied so as to control the current of the battery.

In operation 309, the battery control apparatus controls the current of the battery by comparing the current potential distribution to the side reaction potential. For example, the battery control apparatus repetitively adjusts the currents such that the current potential distribution of the positive electrode is less than the side reaction potential of the positive electrode, and terminates a control of the current usage environment under a condition that the current potential distribution of the positive electrode is less than the side reaction potential of the positive electrode. Likewise, the battery control apparatus repetitively adjusts the currents such that the current potential distribution of the negative electrode is greater than the side reaction potential of the negative electrode, and terminates a control of the current usage environment under a condition that the current potential distribution of the negative electrode is greater than the side reaction potential of the negative electrode. The battery control apparatus extracts a maximum value or a minimum value of the current potential distribution and compare the extracted maximum or minimum value to the side reaction potential, thereby determining a magnitude relationship. The battery control apparatus calculates $\phi_{s,c}$ and $\phi_{s,a}$ during the charging and discharging of the battery and respectively compares $\phi_{s,c}$ and $\phi_{s,a}$ to the side reaction potential of the positive electrode and the side reaction potential of the negative electrode so as to dynamically controls the current of the battery.

Figure 4:
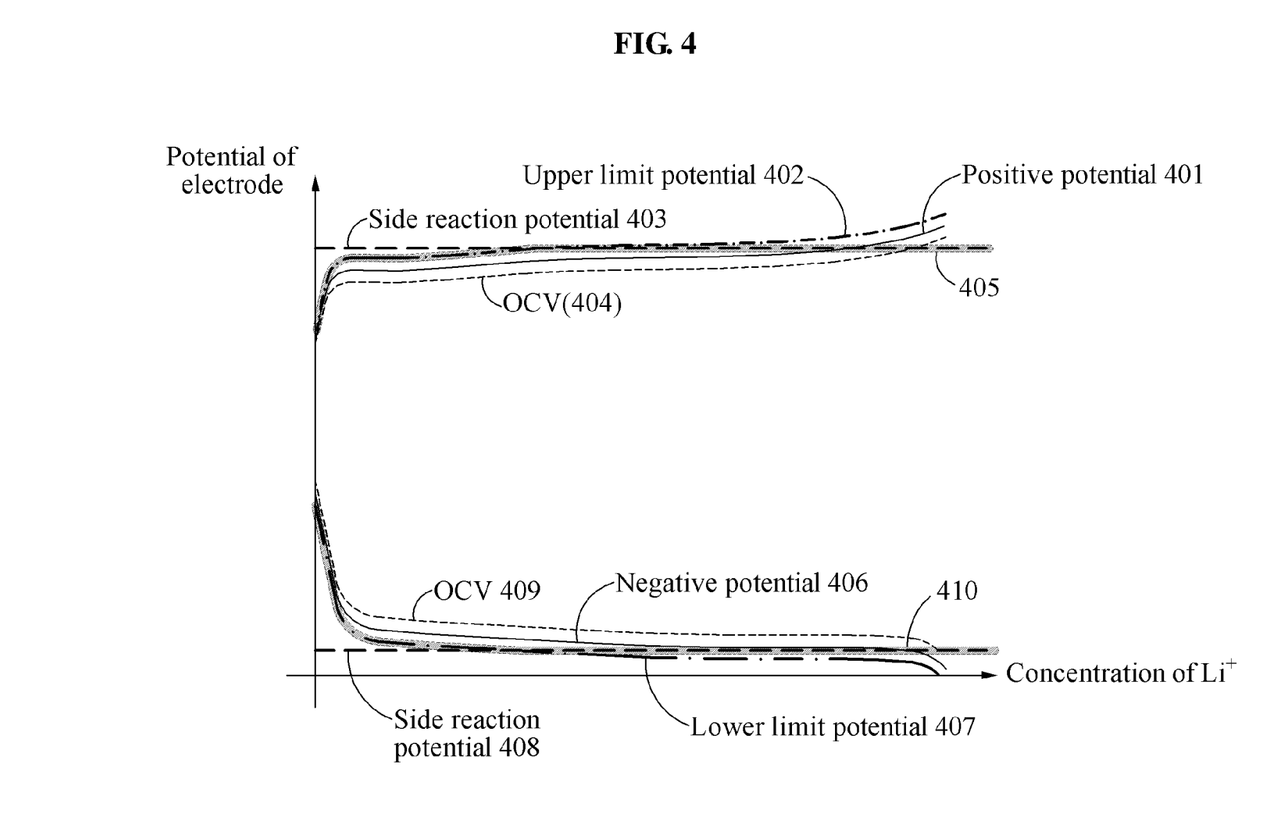
FIG. 4 illustrates an example of controlling a potential of an electrode in a battery.

FIG. 4 illustrates an example of controlling a potential of an electrode in a battery.

Referring to FIG. 4, while a battery is charged, a battery control apparatus controls a current of the battery such that satisfy a condition that a positive potential 401 is less than an upper limit potential 402 of a positive electrode and less than a side reaction potential 403 is satisfied. Here, the satisfied condition is represented by a curve 405. In a graph of FIG. 4, an x axis represents a concentration of lithium ions in a negative electrode. In the graph, the concentration of the lithium ions in the negative electrode increases in a direction from left to right. When the concentration of the lithium ions in the negative electrode increases, the concentration of the lithium ions in a positive electrode decreases. Thus, the concentration of the lithium ions in the positive electrode increases in the direction from left to right in the graph. While the battery is charged, the concentration of the lithium ions in the positive electrode decreases and the concentration of the lithium ions in the negative electrode increases. As such, the concentrations of the lithium ions in the positive electrode and the negative electrode are changed in the direction from left to right in the graph while the battery is charged. Likewise, while the battery is discharged, the concentrations of the lithium ions in the positive electrode and the negative electrode are changed in a direction from right to left in the graph.

As the foregoing, the battery control apparatus calculates the positive potential 401 using an electrochemical model, an overpotential of the positive electrode is determined based on a difference between the positive potential 401 and an open circuit voltage (OCV) 404. The battery control apparatus adjusts the positive potential 401 by controlling the usage environment of the battery and adjusting the overpotential. The OCV may be a potential in a state in which an internal circuit is opened. The OCV may be measured or estimated based on a value to which a potential of an electrode converged over time while a current flowing in the battery is zero. For example, the OCV is estimated based on a lookup table in which an SOC and the OCV are mapped. The battery control apparatus estimates the OCV based on the SOC.

The battery control apparatus calculates the upper limit potential 402 of the positive electrode and the side reaction potential 403 based on the examples described with reference to FIGS. 1 through 3. While the battery is charged, a current concentration distribution of the lithium ions in the positive electrode is changed. Thus, the battery control apparatus dynamically calculates the current concentration distribution of the lithium ions in the positive electrode, and obtains the upper limit potential 402 of the positive electrode to which the calculated current concentration distribution is applied.

In the example of FIG. 4, while the battery is charged, the battery control apparatus controls a current of the battery such that a condition that a negative potential 406 is greater than a lower limit potential 407 of the negative electrode and greater than a side reaction potential 408 is satisfied. Here, the satisfied condition is represented by a curve 410. As discussed above, the concentration of the lithium ions in the negative electrode is changed in the direction from left to right in the graph while the battery is charged. The battery control apparatus calculates the negative potential 406 using the electrochemical model, and an overpotential of the negative electrode is determined based on a difference between the negative potential 406 and an OCV 409. The battery control apparatus adjusts the negative potential 406 by controlling a usage environment of the battery and adjusting the overpotential. The battery control apparatus calculates the lower limit potential 407 of the negative electrode and the side reaction potential 408 based on the examples described with reference to FIGS. 1 through 3. While the battery is charged, a current concentration distribution of the lithium ions in the negative electrode is changed. Thus, the battery control apparatus dynamically calculates the current concentration distribution of the lithium ions in the negative electrode, and obtains lower limit potential 407 of the negative electrode to which the calculated current concentration distribution is applied.

Figure 5:
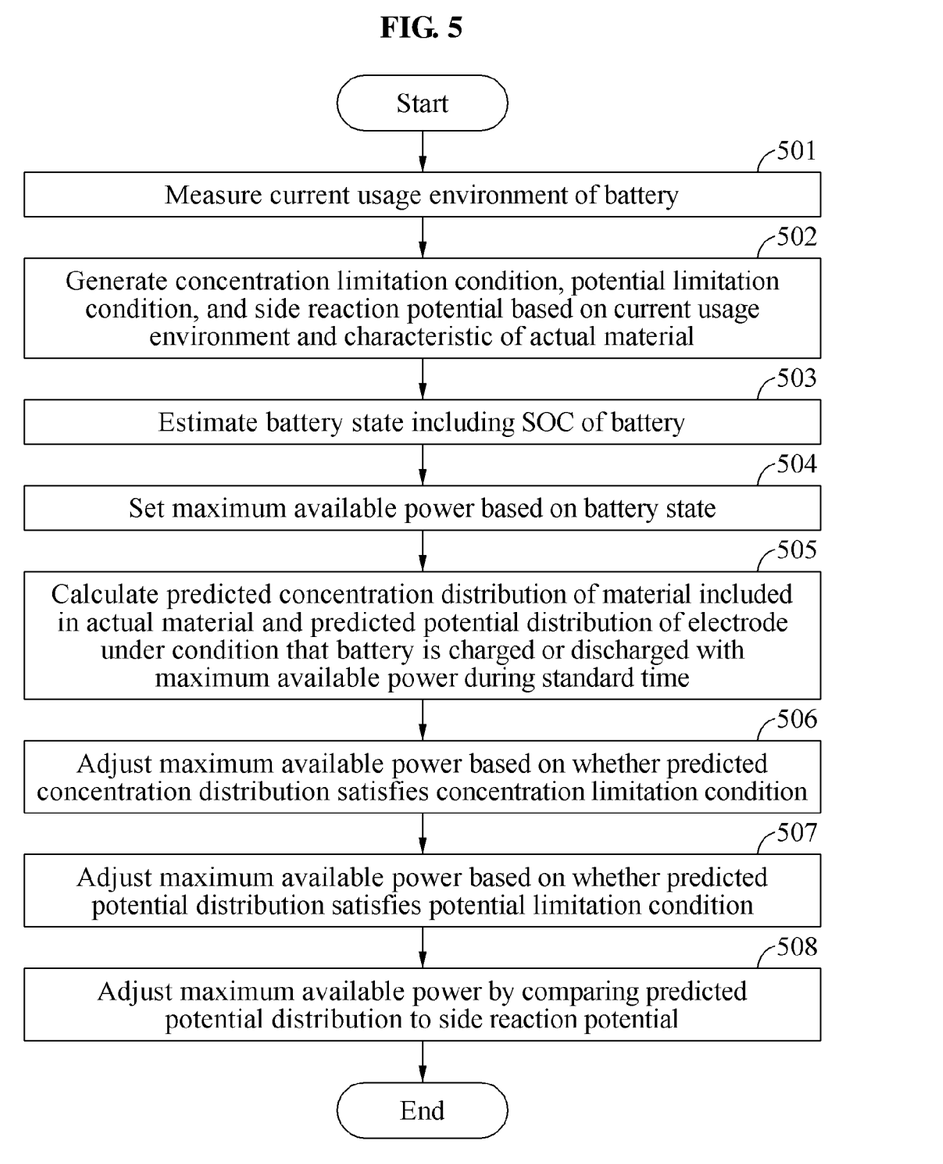
FIG. 5 illustrates an example of a method of controlling a battery.

FIG. 5 illustrates an example of a method of controlling a battery.

In operation 501, a battery control apparatus measures a current usage environment of a battery. In operation 502, the battery control apparatus generates a concentration limitation condition, a potential limitation condition, and a side reaction potential based on the current usage environment and a characteristic of an actual material, and the foregoing descriptions are also applicable here.

In operation 503, the battery control apparatus estimates a battery state including an SOC of the battery. The battery control apparatus estimates the SOC using various schemes such as a voltage measurement. Various methods are also applicable to the battery state estimation.

In operation 504, the battery control apparatus sets the maximum available power based on the battery state. The maximum available power may be a maximum amount of power by which the battery is to be charged or discharged in a current battery state during a standard time. The maximum amount of power by which the battery is to be charged is referred to as, for example, a maximum chargeable power. The maximum amount of power by which the battery is to be discharged is referred to as, for example, a maximum dischargeable power. For example, according to an increase in the SOC, the maximum dischargeable power increases and the maximum chargeable power decreases.

The battery control apparatus calculates the maximum available power such that the battery is charged and/discharged while maintaining conditions of the concentration limitation condition, the potential limitation condition, and the side reaction potential. The battery control apparatus calculates the maximum available power in consideration of the current usage environment of the battery, thereby increasing an accuracy on estimation of the maximum available power.

When the calculation accuracy of the maximum chargeable power is insufficient, the calculation may be performed by reducing the maximum chargeable power to compensate for an error in the calculation. In a case of regenerative braking, the energy efficiency may decrease due to the reduced maximum chargeable power and a difference in maximum outputtable power may cause a difference in lithium ion concentration of the electrode and a potential-related control error, which may lead to the degradation in the battery. The battery control apparatus may apply a concept of the maximum available power to the battery control method described with reference to FIGS. 1 through 4, thereby increasing the energy efficiency of the battery and prolonging a life characteristic.

In operation 505, the battery control apparatus calculates a predicted concentration distribution of the material included in the actual material and a predicted potential distribution of the electrode under a condition that the battery is charged or discharged with the maximum available power during the standard time. The battery control apparatus may calculate the predicted concentration distribution and the predicted potential distribution using the aforementioned method.

In operation 506, the battery control apparatus adjusts the maximum available power based on whether the predicted concentration distribution satisfies the concentration limitation condition. In this example, adjusting the maximum available power includes correcting a calculated value. The battery control apparatus calculates the maximum available power based on the concentration limitation condition, the potential limitation condition and the side reaction potential without iteration of a correcting process.

In operation 507, the battery control apparatus adjusts the maximum available power based on whether the predicted potential distribution satisfies the potential limitation condition. In operation 508, the battery control apparatus adjusts the maximum available power by comparing the predicted potential distribution to the side reaction potential. The battery control apparatus repetitively adjusts the maximum available power so as to obtain an optimized maximum available power.

Figure 6:
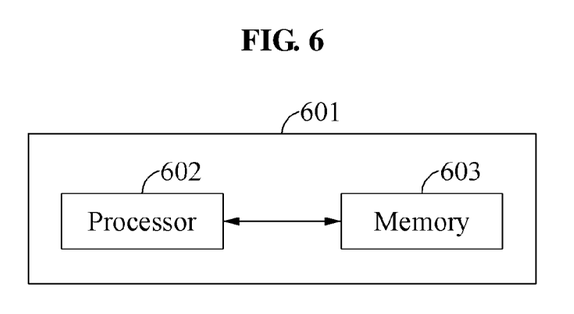
FIG. 6 illustrates an example of a battery control apparatus.

FIG. 6 illustrates an example of a battery control apparatus.

Referring to FIG. 6, a battery control apparatus 601 includes a processor 602 and a memory 603. The processor 602 includes one or more devices described with reference to FIGS. 1 through 5. Also, the processor 602 performs at least one of methods described with reference to FIGS. 1 through 5. The memory 603 stores a program in which a battery control method is implemented. The memory 603 is a volatile memory or a non-volatile memory.

The processor 602 executes the program and controls the battery control apparatus 601. A code of the program executed by the processor 602 is stored in the memory 603. The battery control apparatus 601 is connected to an external device, for example, a personal computer (PC) or a network through an input and output device (not shown) to perform a data exchange.

The processor 602 in FIG. 6 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1, 3, and 5 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of controlling a battery, comprising:
measuring a current usage environment of a battery;
generating a concentration limitation condition of a material in an active material of the battery based on a characteristic of the active material; and
controlling a usage environment of the battery based on the current usage environment and the concentration limitation condition.

2. The method of claim 1, wherein the controlling of the usage environment of the battery comprises:
calculating a current concentration distribution of the material in the active material based on the current usage environment and the characteristic of the active material; and
controlling a current of the battery based on whether the current concentration distribution satisfies the concentration limitation condition.

3. The method of claim 1, further comprising:
generating a potential limitation condition for an electrode of the battery based on the current usage environment and the concentration limitation condition; and
controlling the usage environment of the battery based on the current usage environment and the potential limitation condition.

4. The method of claim 3, wherein the controlling of the usage environment of the battery comprises:
calculating a current potential distribution of the electrode based on the current usage environment and the characteristic of the active material; and
controlling a current of the battery based on whether the current potential distribution satisfies the potential limitation condition.

5. The method of claim 1, further comprising:
determining a side reaction potential that triggers a side reaction between the material and an electrolyte in which the material moves based on any one or any combination of any two or more of the characteristic of the active material, a characteristic of the material, and a characteristic of the electrolyte; and
controlling the usage environment of the battery based on the current usage environment and the side reaction potential.

6. The method of claim 5, wherein the controlling of the usage environment of the battery comprises:
calculating a current potential distribution of an electrode of the battery based on the current usage environment and the characteristic of the active material; and
controlling a current of the battery by comparing the current potential distribution to the side reaction potential.

7. The method of claim 1, wherein the active material comprises a positive active material and a negative active material, and
the generation of the concentration limitation condition comprises determining an upper limit concentration and a lower limit concentration of a material in the positive active material and an upper limit concentration and a lower limit concentration of a material in the negative active material.

8. The method of claim 7, further comprising:
generating a potential limitation condition on an electrode of the battery based on the current usage environment and the concentration limitation condition; and
controlling the usage environment of the battery based on the current usage environment and the potential limitation condition.

wherein the generating of the potential limitation condition comprises:
calculating an upper limit concentration and a lower limit concentration of a positive electrode based on the upper limit concentration and the lower limit concentration of the material in the positive active material; and
calculating an upper limit concentration and a lower limit concentration of a negative electrode based on the upper limit concentration and the lower limit concentration of the material in the negative active material.

9. The method of claim 1, wherein the current usage environment comprises a temperature, a voltage, and a current of the battery.

10. The method of claim 1, wherein the generating of the concentration limitation condition comprises generating the concentration limitation condition based on a degree of degradation in the battery.

11. The method of claim 1, wherein the controlling of the usage environment of the battery comprises:
estimating a battery state comprising a state of charge (SOC) of the battery; and
determining a maximum available power for charging or discharging during a standard time based on the battery state and the concentration limitation condition.

12. The method of claim 11, wherein the determining of the maximum available power comprises:
setting the maximum available power based on the battery state; and
adjusting the set maximum available power based on the concentration limitation condition.

13. The method of claim 12, wherein the adjusting of the set maximum available power based on the concentration limitation condition comprises:
calculating a predicted concentration distribution of the material in the active material under a condition that charging or discharging of the set maximum available power is performed during the standard time; and
adjusting the set maximum available power based on whether the predicted concentration distribution satisfies the concentration limitation condition.

14. The method of claim 12, wherein the determining of the available power further comprises:
generating a potential limitation condition on an electrode of the battery based on the current usage environment and the concentration limitation condition; and
adjusting the set maximum available power based on the potential limitation condition.

15. The method of claim 14, wherein the adjusting of the set maximum available power based on the potential limitation condition comprises:

calculating a predicted potential distribution of the electrode under a condition that charging or discharging of the set maximum available power is performed during the standard time; and
adjusting the set maximum available power based on whether the predicted potential distribution satisfies the potential limitation condition.

16. The method of claim 12, wherein the determining of the maximum available power further comprises:
determining a side reaction potential that triggers a side reaction between the material and an electrolyte in which the material moves based on any one or any combination of any two or more of the characteristic of the active material, a characteristic of the material, and a characteristic of the electrolyte; and
adjusting the set maximum available power based on the side reaction potential.

17. The method of claim 16, wherein the adjusting of the set maximum available power based on the side reaction potential comprises:
calculating a predicted potential distribution of an electrode of the battery under a condition that charging or discharging of the set maximum available power is performed during the standard time; and
adjusting the set maximum available power by comparing the predicted potential distribution to the side reaction potential.

18. A non-transitory computer-readable medium storing program instructions that, when executed by a processor, cause the processor to perform the method of claim 1, wherein the material is lithium ions and the active material is a lithium compound.

19. A battery control apparatus, comprising:
a processor configured to:
measure a current usage environment of a battery;
generate a concentration limitation condition on a material in an active material of the battery based on a characteristic of the active battery; and
control a usage environment of the battery based on the current usage environment and the concentration limitation condition.

20. The battery control apparatus of claim 19, wherein the processor is further configured to:
generate a potential limitation condition on an electrode of the battery based on the current usage environment and the concentration limitation condition; and
determine a side reaction potential that triggers a side reaction between the material and an electrolyte in which the material moves based on any one or any combination of any two or more of the characteristic of the active material, a characteristic of the material, and a characteristic of the electrolyte.

* * * * *